United States Patent
Hsiung et al.

(10) Patent No.: US 7,654,623 B2
(45) Date of Patent: Feb. 2, 2010

(54) SLIDE ASSEMBLY WITH LOCKING DEVICE

(75) Inventors: Hai-Hung Hsiung, Taipei Hsien (TW); Zhao-Guo Wen, Shenzhen (CN); Li-Hui Gao, Shenzhen (CN); Jie Li, Shenzhen (CN); Bing Xiao, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 42 days.

(21) Appl. No.: 11/849,307

(22) Filed: Sep. 3, 2007

(65) Prior Publication Data
US 2009/0026904 A1    Jan. 29, 2009

(30) Foreign Application Priority Data
Jul. 27, 2007    (CN) .................. 2007 2 0200720 U

(51) Int. Cl.
*A47B 88/04* (2006.01)
(52) U.S. Cl. ................................. 312/333; 312/334.44
(58) Field of Classification Search ............. 312/330.1, 312/333, 319.1, 334.1, 334.7, 334.8, 334.11, 312/334.44, 334.46; 384/20, 21, 22
See application file for complete search history.

(56) References Cited

U.S. PATENT DOCUMENTS

| | | | | | |
|---|---|---|---|---|---|
| 1,969,749 | A | * | 8/1934 | Harsh | ........................... 292/73 |
| 4,200,342 | A | * | 4/1980 | Fall | .............................. 384/19 |
| 5,292,198 | A | * | 3/1994 | Rock et al. | .................... 384/21 |
| 5,851,059 | A | * | 12/1998 | Cirocco | ................. 312/334.11 |
| 6,155,661 | A | * | 12/2000 | O'Neil et al. | .......... 312/334.44 |
| 7,364,244 | B2 | * | 4/2008 | Sandoval | .................... 312/333 |
| 7,405,926 | B2 | * | 7/2008 | Wu et al. | ............... 361/679.27 |

* cited by examiner

*Primary Examiner*—James O Hansen
(74) *Attorney, Agent, or Firm*—Frank R. Niranjan

(57) ABSTRACT

A slide assembly for slidably mounts a server unit (100) to a rack (200), said slide assembly includes an inner slide (110), an outer slide (150) and a locking device (130). The inner slide has an inner side (111). A locking device disposed on the inner side of the inner slide at a distal end thereof, the locking device includes a spring (133), a locking member (135), and a base (131), the base has a receiving opening (1315), the locking member being held within the base and resiliently protruding out from the receiving opening by support of the spring. An outer slide slidably attached to the inner side of the inner slide, the outer slide defines an engaging opening (153) at a distal end corresponding to the locking member, the locking member in alignment with the engaging opening to limit a back and forth longitudinal movement of the inner slide.

2 Claims, 6 Drawing Sheets

SLIDE ASSEMBLY WITH LOCKING DEVICE

BACKGROUND

1. Field of the Invention

The present invention relates to a slide assembly, particularly to a slide assembly with a locking device.

2. Description of related art

A conventional three-section slide for a server unit includes an inner slide, an outer slide, and a third slide. A slide-aiding ball member is sandwiched between any two of the inner slide, the outer slide, and the third slide so as to smoothen sliding movement. Moreover, the inner slide and the outer slide have a retaining member and a stop member mounted thereon respectively, for restricting movement. The retaining member is attached to an inner surface of the inner slide, and is provided with an engaging portion. The stop member is mounted to a front end of the outer slide, and is provided with a protrusion. To prevent accidental disassembly, when users draw out the inner slide from the outer slide, the protrusion of the stop member engages with the engaging portion of the retaining member.

Although the engagement of the stop member with the engaging portion can avoid releasing the inner slide from the outer slide by accident, the portion of the engagement is positioned at a distal end of the outer slide, the inner slide and the outer slide can hurt user's finger by accident when the user directly disengages the engaging portion from the stop member so as to retract the inner slide into the outer slide. Therefore, it is inconvenient and dangerous for users to operate the slide.

What is needed, therefore, is a locking device for a slide assembly which is easily and safely operated.

SUMMARY

A slide assembly for slidably mounts a server unit to a rack, said slide assembly includes an inner slide, an outer slide and a locking device. The inner slide has an inner side. A locking device disposed on the inner side of the inner slide at a distal end thereof, the locking device includes a spring, a locking member, and a base, the base has a receiving opening, the locking member being held within the base and resiliently protruding out from the receiving opening by support of the spring. An outer slide slidably attached to the inner side of the inner slide, the outer slide defines an engaging opening at a distal end corresponding to the locking member, the locking member in alignment with the engaging opening to limit a back and forth longitudinal movement of the inner slide.

Other advantages and novel features of the present invention will become more apparent from the following detailed description of a preferred embodiment when taken in conjunction with the accompanying drawings, in which:

DETAILED DESCRIPTION

Figure 1:
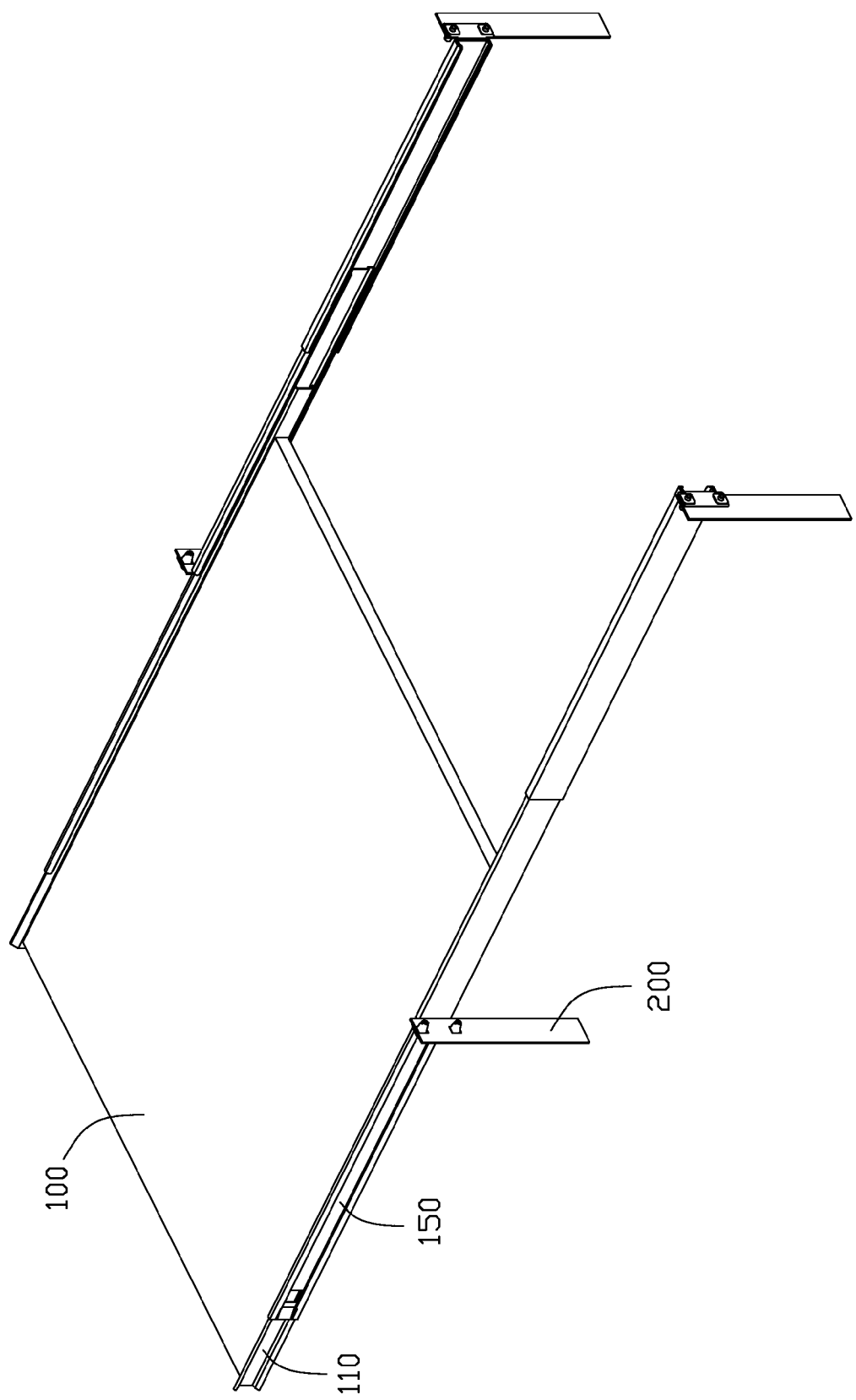
FIG. 1 is an assembled, isometric view of a slide assembly attached to a rack for guiding a server in accordance with a preferred embodiment of the present invention, the slide assembly comprising an outer slide, a locking device, and an inner slide.

Referring to FIG. 1, a slide assembly for slidably mounting a server unit 100 to a rack 200 is shown. The slide assembly includes an inner slide 110, and an outer slide 150. The inner slide 110 is attached to the server unit 100. The outer slide 150 is rigidly fixed to the rack 200. The server unit 100 of FIG. 1 is in an extended position, where it has been slid out of a front of the rack 200. In this orientation, a technician can gain access to the server unit 100 while it is still mounted to the rack.

Figure 2:
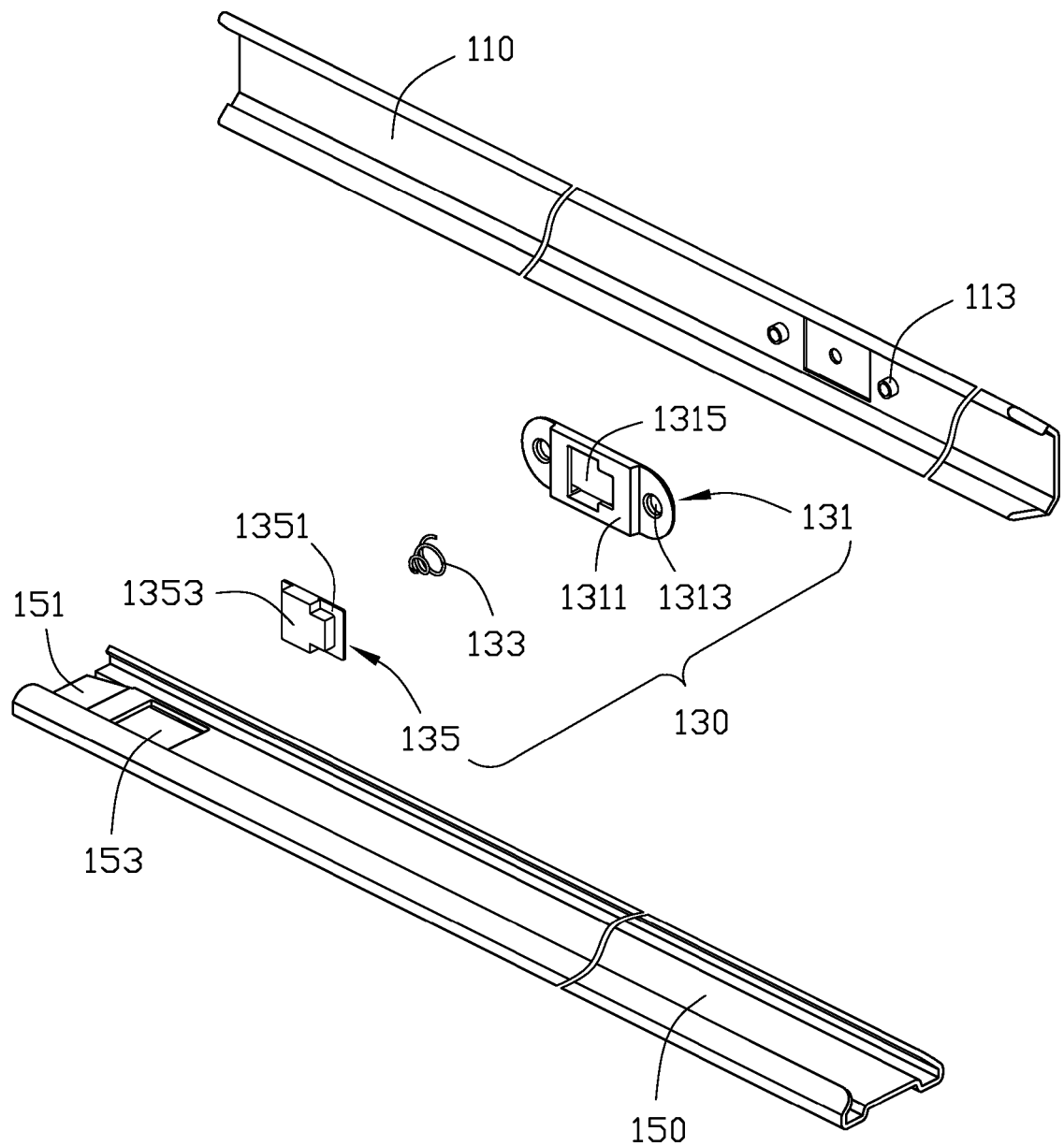
FIG. 2 is an exploded view of the slide assembly of FIG. 1.

Referring to FIG. 2, the inner slide 110 includes an outer side which can be fixed to the server unit 100 and an inner side 111 which faces the outer slide 150. Two rivets 113 are formed on an end portion of the inner side of the inner slide 110. A locking device 130 is attached to the inner slide 110. The locking device 130 includes a base 131, which has a retraction space, a locking member 135, and a tapered coil compression spring 133, which is fixed between the inner slide 110 and the locking member 135. Two rivet holes 1313 are formed on the base 131 corresponding to the rivets 113 of the inner slide 110. A protuberant portion 1311 is formed on a middle portion of the base 131. The protuberant portion 1311 has a T-shaped receiving opening 1315. The locking member 135 has a bottom wall 1351. AT-shaped engaging protrusion 1353 perpendicularly extends out from the bottom wall 1351. A front portion of the outer slide 150 has an inclined entry plane 151 for guiding the inner sidle 110 to slide in the outer slide 150. The outer slide 150 defines an engaging opening 153 corresponding to the engaging protrusion 1353. The engaging protrusion 1353 can be received in the engaging opening 153.

Figure 3:
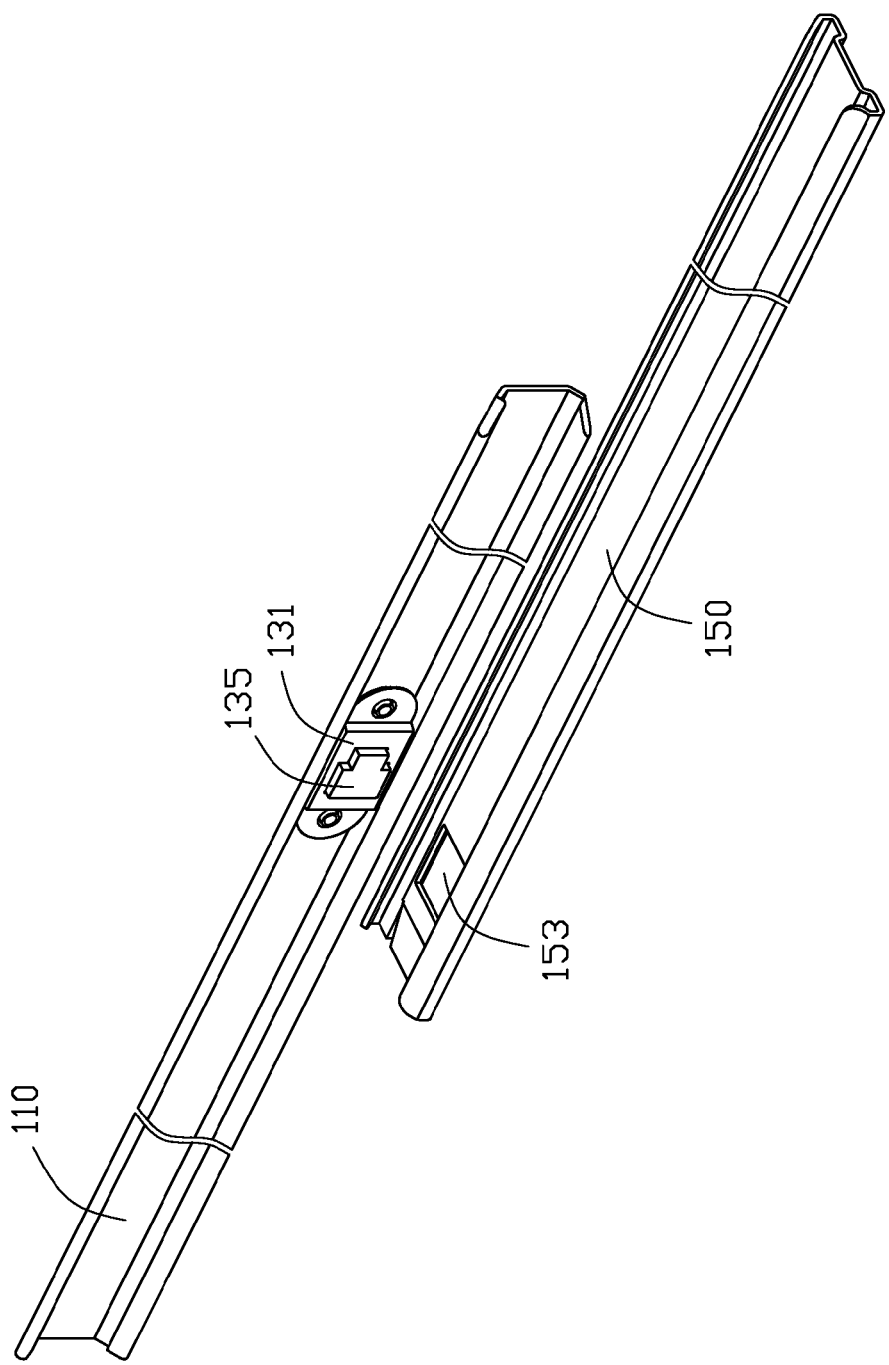
FIG. 3 is a partially assembled view of FIG. 2.
Figure 4:
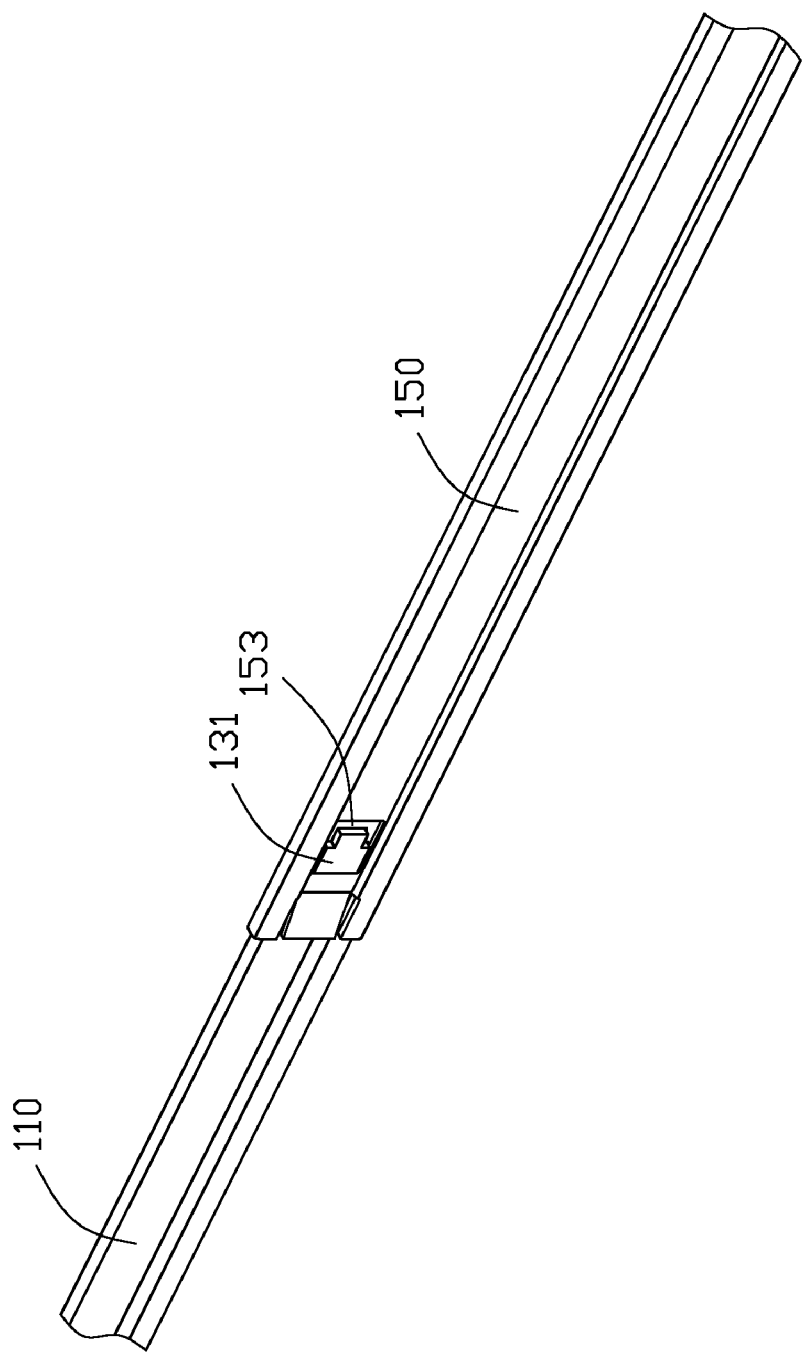
FIG. 4 is an assembled view of FIG. 2.

Referring also to FIG. 3 and FIG. 4, when assembling the slide assembly, the locking member 135 is received in the protuberant portion 1311 of the base 131. The engaging protrusion 1353 of the locking member 135 is in the receiving opening 1315. The coil compression spring 133 is positioned between the inner slide 110 and the locking member 135. Then the base 131 is riveted to the inner slide 110 via the rivets 113 being received in the corresponding rivet holes 1313. At this time, the locking member 135 is resiliently held in place by the coil compression spring 133 in the retraction space of the base 131. The end portion of the inner slide 110 is slid to a front portion of the outer slide 150 until the inclined entry plane 151 presses the engaging protrusion 1353 of the locking member 135 to urge the engaging protrusion 1353 to retract into the base 331. When the engaging protrusion 1353 is aligned with the engaging opening 153 of the outer slide 150, the coil compression spring 133 rebounds to an original state, the engaging protrusion 1353 engaging with the engaging opening 153. The engaging opening 153 engages with the locking member 135 to limit back and forth movements of the inner slide 110. The engaging protrusion 1353 disengages from the engaging opening 153. The inner slide 110 slides relative to the outer slide 150 to retract.

Figure 5:
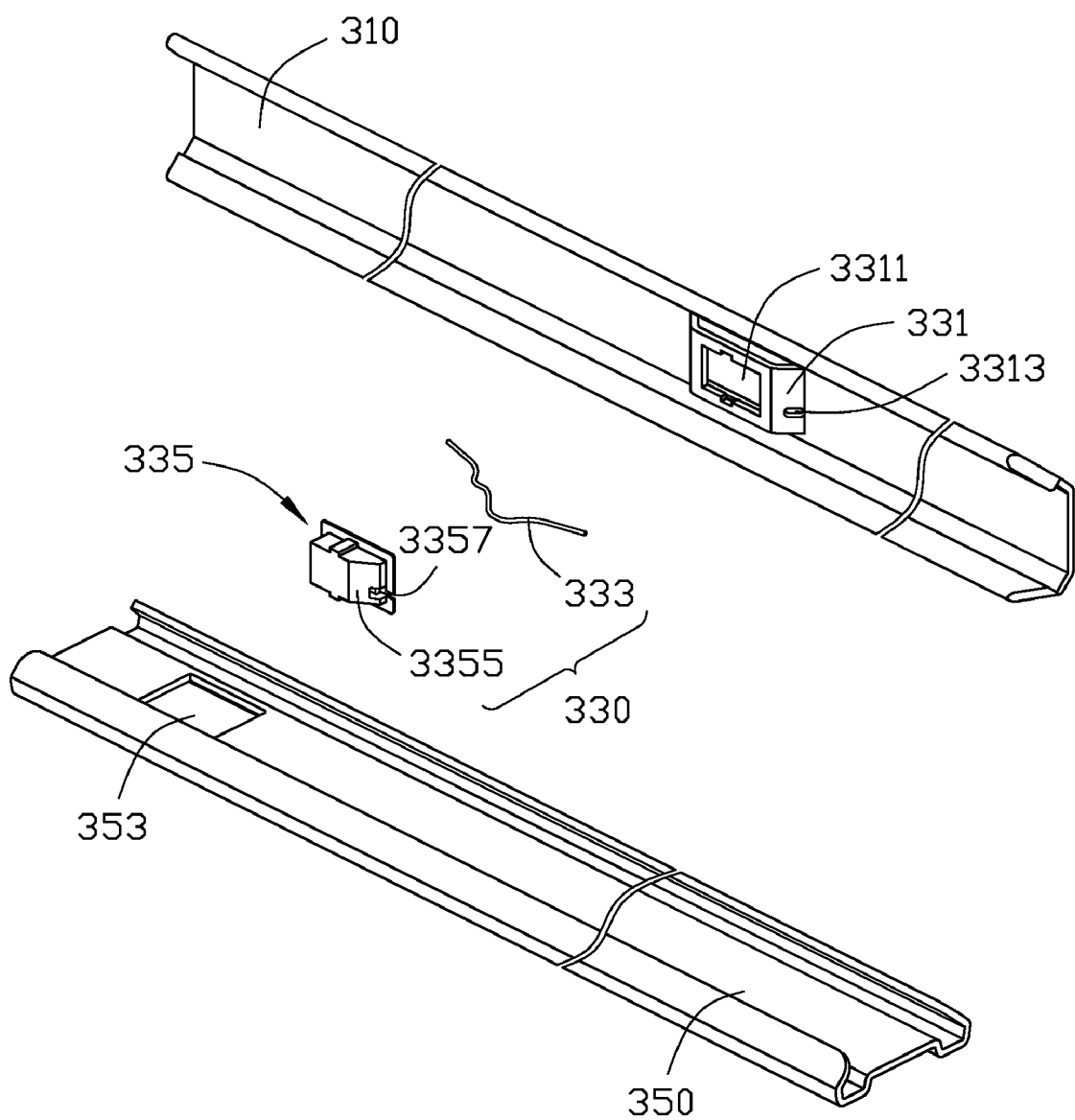
FIG. 5 is an exploded, isometric view of a slide assembly in accordance with another preferred embodiment of the present invention.
Figure 6:
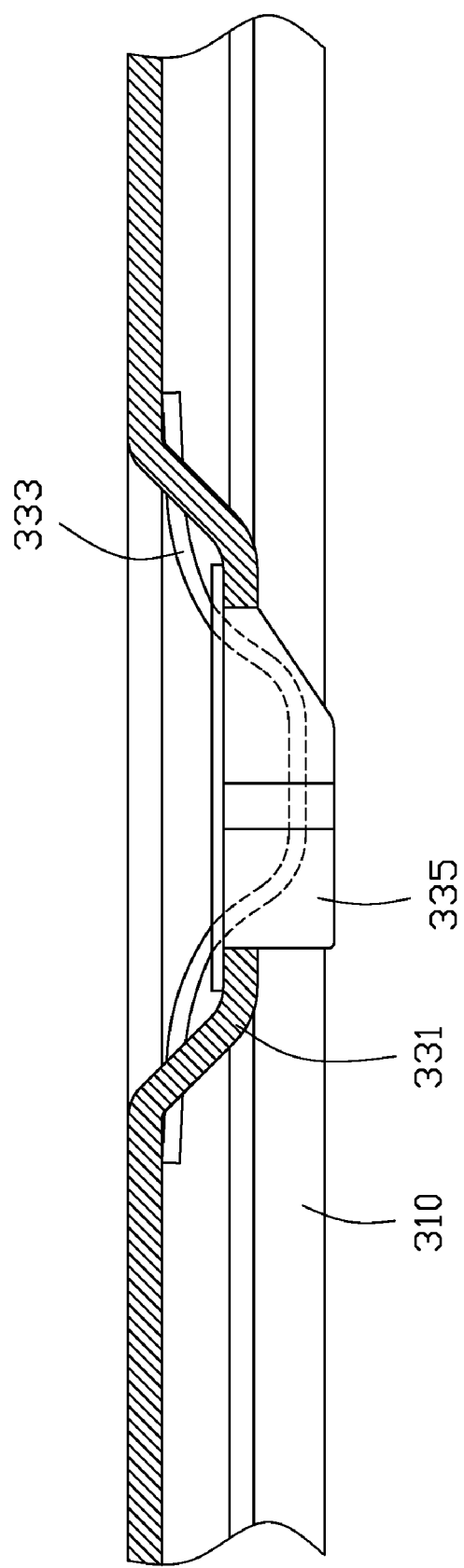
FIG. 6 is a partially sectional view of FIG. 4.

Referring also to FIG. 5 and FIG. 6, a slide assembly in accordance with another preferred embodiment of the present invention includes, an inner slide 310, a locking device 330, and an outer slide 350. The locking device 330 includes a snakelike resilient member 333, a locking member 335, and a base 331, which is formed on the inner slide 310. The base 331 receives the locking member 335 and the resilient member 333. The base 331 defines a receiving opening 3311. The base 331 has a retraction space and retaining portion 3313. The locking member 335 has a wedge-shaped portion 3355 and two holes 3357. The outer slide 350 defines an engaging opening 353 corresponding to the locking member 335. The resilient member 333 inserts through the retaining portion of the base and the locking member 335. The locking member 335 is resiliently held in the base 331 by the resilient member 333. When using the slide assembly, an end portion of the inner slide 310 is slid to a front portion of the outer slide 350 until the outer slide 350 presses the cuneiform portion 3355 of the locking member 335 to urge the locking member 335 to retract into the base 331. When the locking member 335 moves to align with the engaging opening 353 of the outer slide 350, the resilient member 333 rebounds to an original state, the locking member 335 engages with the engaging opening 353. The engaging opening 353 engages with the locking member 335 to limit a longitudinal movement of the inner slide 310 to extend from the outer slide 350. When the inner slide 310 is retracted relative to the outer slide 350. The locking member 335 is pressed in, as a result of the cuneiform portion 3355 abutting against the outer slide 350. The inner slide 310 is retracted.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A slide assembly for slidably mounting a server unit to a rack, said slide assembly comprising:

an inner slide having an inner side;
   a locking device disposed on the inner side of the inner slide at a distal end thereof, the locking device comprising a spring, a locking member, and a base, the base having a receiving opening, the locking member having a bottom wall for being held within the base and resiliently protruding out from the receiving opening by support of the spring, the bottom wall being larger than the receiving opening; and
   an outer slide slidably attached to the inner side of the inner slide, the outer slide defining an engaging opening at a distal end corresponding to the locking member, the locking member in alignment with the engaging opening to limit a back and forth longitudinal movement of the inner slide;
   wherein the receiving opening of the base is T-shaped, and a corresponding T-shaped engaging protrusion extends perpendicularly from the bottom wall of the locking member corresponding to the receiving opening; and
   wherein an inclined entry plane is formed on the outer slide at the distal end thereof for guiding the inner slide to slide into the outer slide.

2. The slide assembly as described in claim 1, wherein the spring is taper-shaped and the spring is retained between the inner slide and the locking member.

* * * * *